(12) United States Patent
Maule et al.

(10) Patent No.: US 9,329,763 B2
(45) Date of Patent: May 3, 2016

(54) METHOD AND DEVICE FOR DETERMINING GEOMETRIC PROPERTY

(71) Applicant: General Electric Company, Schenectady, NY (US)

(72) Inventors: Bryan David Maule, Camillus, NY (US); Michael Melvin Ball, Baldwinsville, NY (US)

(73) Assignee: General Electric Company, Schenectady, NY (US)

( * ) Notice: Subject to any disclaimer, the term of this patent is extended or adjusted under 35 U.S.C. 154(b) by 163 days.

(21) Appl. No.: 14/172,371

(22) Filed: Feb. 4, 2014

(65) Prior Publication Data

US 2015/0220261 A1  Aug. 6, 2015

(51) Int. Cl.
| | |
|---|---|
| *G06F 3/0488* | (2013.01) |
| *G06F 3/0484* | (2013.01) |
| *G01C 11/00* | (2006.01) |
| *G06F 3/041* | (2006.01) |
| *G01B 21/02* | (2006.01) |

(Continued)

(52) U.S. Cl.
CPC .......... *G06F 3/04847* (2013.01); *G01B 21/02* (2013.01); *G01B 21/28* (2013.01); *G01C 11/00* (2013.01); *G06F 3/041* (2013.01); *G06F 3/0488* (2013.01); *G06T 7/60* (2013.01)

(58) Field of Classification Search
CPC ........ G01B 21/02; G01B 21/28; G01C 11/00; G06F 3/041; G06F 3/04847; G06F 3/0488; G06T 7/60
USPC ....................................................... 345/173
See application file for complete search history.

(56) References Cited

U.S. PATENT DOCUMENTS

| | | |
|---|---|---|
| 6,007,939 A | 12/1999 | Clowers |
| 6,099,097 A | 8/2000 | Hocker et al. |

(Continued)

FOREIGN PATENT DOCUMENTS

| | | |
|---|---|---|
| DE | 102008020772 A1 | 10/2009 |
| EP | 0559594 A1 | 9/1993 |
| WO | 2014006832 A1 | 1/2014 |

OTHER PUBLICATIONS

Search Report and Opinion issued in connection with corresponding Application No. PCT/US2015/011077 on Apr. 17, 2015.

(Continued)

*Primary Examiner* — Viet Pham
(74) *Attorney, Agent, or Firm* — Barclay Damon, LLP

(57) ABSTRACT

A method for determining a type of a measurement includes receiving touch data via a touchscreen; automatically identifying a plurality of cursor points in the touch data using a processor; and automatically determining a measurement type based on the touch data using the processor. A method for determining a geometric property of an object further includes displaying an image of the object on the touchscreen and automatically determining the geometric property corresponding to the plurality of cursor points and the determined measurement type using the processor. A device for determining the geometric property includes an imager for obtaining the image; the touchscreen; and the processor for identifying a plurality of cursor points in the touch data, determining a measurement type of the geometric property using the touch data, and automatically determining the geometric property corresponding to the plurality of cursor points and the determined measurement type.

17 Claims, 10 Drawing Sheets

(51) Int. Cl.
*G01B 21/28* (2006.01)
*G06T 7/60* (2006.01)

(56) References Cited

U.S. PATENT DOCUMENTS

| | | |
|---|---|---|
| 6,272,717 B1 | 8/2001 | Saraydar |
| 6,656,626 B1 | 12/2003 | Mooty et al. |
| 6,670,808 B2 | 12/2003 | Nath et al. |
| 6,697,764 B2 | 2/2004 | Corby, Jr. et al. |
| 6,890,196 B2 | 5/2005 | Vila |
| 7,902,990 B2 | 3/2011 | Delmonico et al. |
| 8,100,440 B2 | 1/2012 | Yu |
| 8,217,646 B2 | 7/2012 | Karpen |
| 8,276,989 B2 | 10/2012 | Rogers et al. |
| 8,310,604 B2 | 11/2012 | Delmonico et al. |
| 8,343,115 B2 | 1/2013 | Lynch et al. |
| 8,368,749 B2 | 2/2013 | Lambdin et al. |
| 8,638,984 B2 | 1/2014 | Roithmeier |
| 2005/0129108 A1 | 6/2005 | Bendall et al. |
| 2011/0115730 A1* | 5/2011 | Kim .................. G06F 3/04883 345/173 |
| 2011/0260033 A1 | 10/2011 | Steffensen et al. |
| 2014/0005978 A1 | 1/2014 | Shimizu et al. |

OTHER PUBLICATIONS

Inspection Manager Quick Reference Guide, Corporate publication by General Electric Inspection Technologies, published 2010. Retrieved Feb. 3, 2014 from http://www.ge-mcs.com/en/remote-visual-inspection/software/inspection-manager.html. (25 pages).

Inspection Manager Software, by General Electric Inspection Technologies, published 2010. Available at http://www.ge-mcs.com/en/remote-visual-inspection/software/inspection-manager.html. (1 page).

GE Measurement & Control Solutions; XLG3 Video Probe, Inspection Technologies, 2012, 16 pages.

GE Measurement & Control, XL Go+ Video Probe, Inspection Technologies, 2012, 16 pages.

* cited by examiner

METHOD AND DEVICE FOR DETERMINING GEOMETRIC PROPERTY

BACKGROUND OF THE INVENTION

The subject matter disclosed herein relates to methods and devices for determining a geometric property of an object.

Video inspection devices, such as video endoscopes or borescopes, can be used to inspect a surface of an object to identify and analyze anomalies on the object that may have resulted from damage, wear, corrosion, or improper installation. In many instances, the surface of the object is inaccessible and cannot be viewed without the use of the video inspection device. It is often necessary to determine geometric properties of objects or anomalies, e.g., length or area, using the video inspection device. However, some conventional video inspection devices do not provide convenient ways of specifying the features to be measured or the type of measurement to take.

The discussion above is merely provided for general background information and is not intended to be used as an aid in determining the scope of the claimed subject matter.

BRIEF DESCRIPTION OF THE INVENTION

According to various aspects, a method for determining a type of a measurement includes receiving touch data via a touchscreen; automatically identifying a plurality of cursor points in the touch data using a processor; and automatically determining a measurement type based on the touch data using the processor. A method for determining a geometric property of an object according to various aspects further includes displaying an image of the object on the touchscreen and automatically determining the geometric property corresponding to the plurality of cursor points and the determined measurement type using the processor. A device for determining the geometric property according to various aspects includes an imager for obtaining the image; the touchscreen; and the processor for identifying a plurality of cursor points in the touch data, determining a measurement type of the geometric property using the touch data, and automatically determining the geometric property corresponding to the plurality of cursor points and the determined measurement type.

An advantage that may be realized in the practice of some disclosed embodiments of the methods or device is that the measurement type is automatically determined. The user advantageously can specify the type of measurement and the cursor points in one operation rather than in separate type-selecting and point-selecting operations.

In one embodiment, a method for determining a geometric property of an object is disclosed. The method comprises displaying an image of the object on a touchscreen; receiving touch data via the touchscreen; automatically identifying a plurality of cursor points in the touch data using a processor; automatically determining a measurement type of the geometric property using the touch data; and automatically determining the geometric property corresponding to the plurality of cursor points and the determined measurement type using the processor. In another embodiment a method for determining a type of a measurement is disclosed. The method comprises receiving touch data via a touchscreen; automatically identifying a plurality of cursor points in the touch data using a processor; and automatically determining the type of the measurement based on the touch data using the processor. In still another embodiment, a device for determining a geometric property of an object is disclosed. The device comprises an imager for obtaining at least one image of the object; a touchscreen for displaying the at least one image of the object and for receiving touch data; and a processor for automatically identifying a plurality of cursor points in the touch data; automatically determining a measurement type of the geometric property using the touch data; and automatically determining the geometric property corresponding to the plurality of cursor points and the determined measurement type.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of the invention. In the drawings, like numerals are used to indicate like parts throughout the various views. Thus, for further understanding of the invention, reference can be made to the following detailed description, read in connection with the drawings in which.

DETAILED DESCRIPTION OF THE INVENTION

In the following description, some aspects will be described in terms that would ordinarily be implemented as software programs. Those skilled in the art will readily recognize that the equivalent of such software can also be constructed in hardware (hard-wired or programmable), firmware, or micro-code. Accordingly, aspects of the present invention may take the form of an entirely hardware embodiment, an entirely software embodiment (including firmware, resident software, or micro-code), or an embodiment combining software and hardware aspects. Software, hardware, and combinations can all generally be referred to herein as a "service," "circuit," "circuitry," "module," or "system." Various aspects can be embodied as systems, methods, or computer program products. Because data manipulation algorithms and systems are well known, the present description will be directed in particular to algorithms and systems forming part of, or cooperating more directly with, systems and methods described herein. Other aspects of such algorithms and systems, and hardware or software for producing and otherwise processing signals or data involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Figure 1:
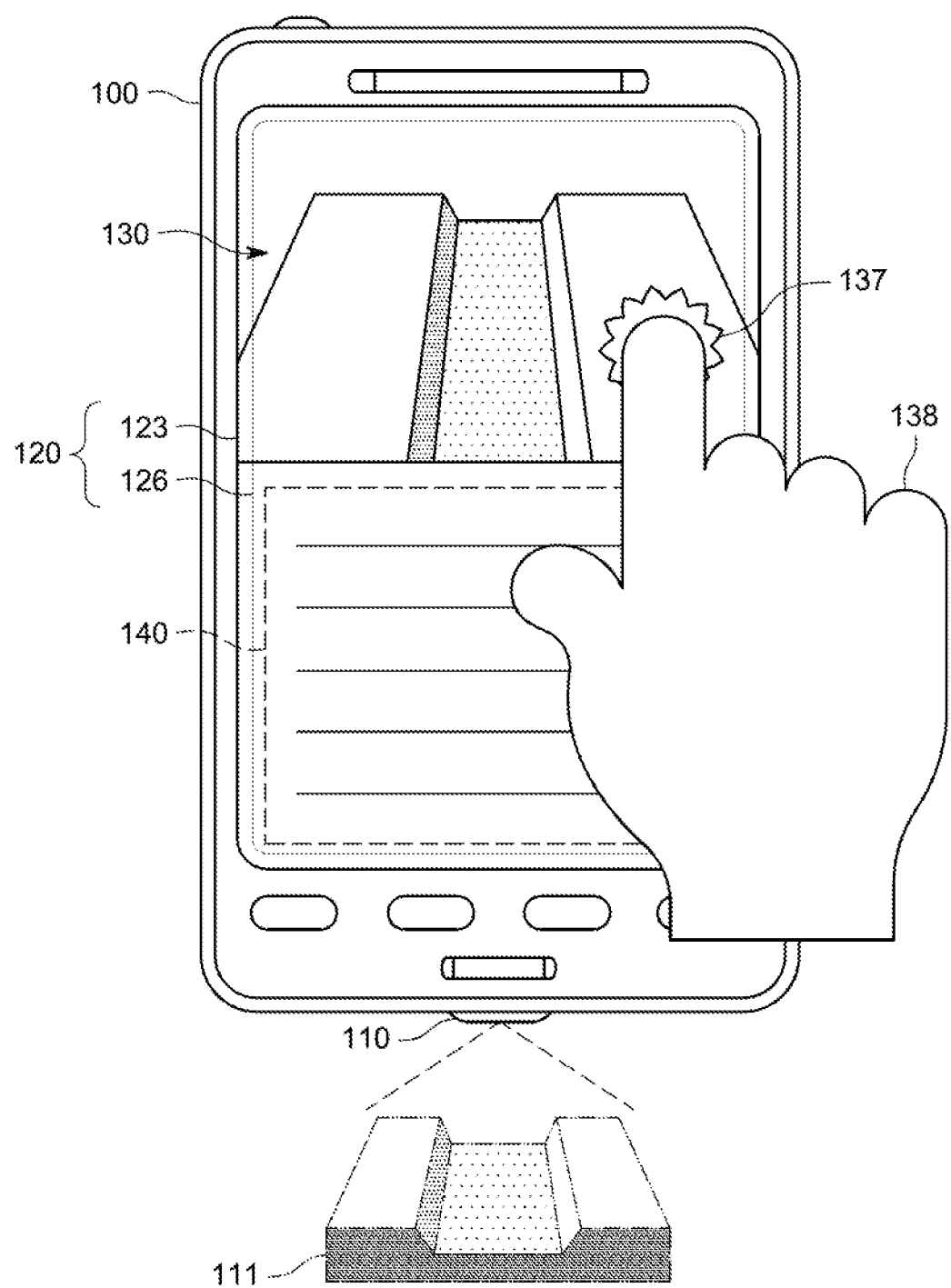
FIG. 1 is a front view of an exemplary device for determining a geometric property of an object and an illustration of an exemplary user interface of the device.

FIG. 1 is a front view of an exemplary device 100 for determining a geometric property of an object 111 and shows an exemplary user interface of device 100. Device 100 includes an imager 110 for obtaining at least one image of object 111 (shown in phantom). A touchscreen 120 is configured to display the at least one image of object 111 on a display 123 and to receive touch data via a touch sensor 126. An exemplary displayed image 130 is shown, as is a touch 137 on touchscreen 120 by a user 138. The touchscreen 120 can also display other information, e.g., in display area 140. The exemplary configuration illustrated has a smartphone form factor. However, other form factors can also be used, e.g., the form factor of an XLG3 or XLG0 borescope by GENERAL ELECTRIC, a desktop computer, a laptop computer, a personal digital assistant, a digital camera, or a conventional cellular phone. For example, device 100 can include a housing holding touchscreen 120 and an insertion tube extending from the housing and carrying imager 110 at a distal end of the insertion tube. Imager 110 in device 100, and in other configurations of video inspection devices described herein, is not limited to capturing a visible-light image of object 111. Imager 110 can also or alternatively, e.g., capture an infrared-light image of object 111, or collect data in a non-imaging modality and produce a synthetic image showing the structure of one or more surfaces of object 111.

Figure 2:
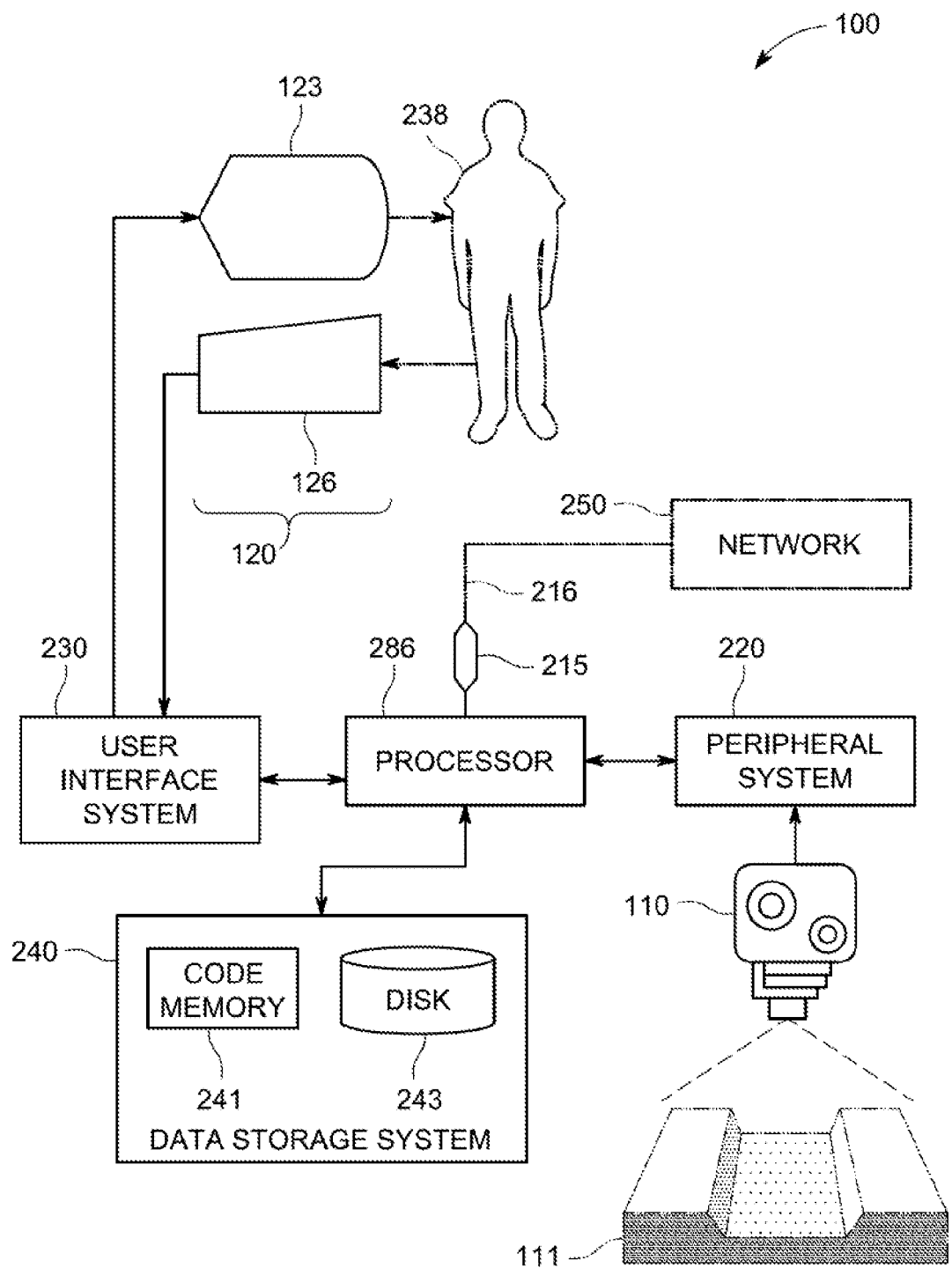
FIG. 2 is a schematic of structures within the device shown in FIG. 1 and related components.

FIG. 2 is a schematic of structures within device 100 and related components, and shows the components of a data-processing system for analyzing touch data or image data and performing other functions described herein. Touchscreen 120 with display 123 and touch sensor 126 is as shown in FIG. 1. The system includes a processor 286, a peripheral system 220, a user interface system 230, and a data storage system 240. The peripheral system 220, the user interface system 230 and the data storage system 240 are communicatively connected to the processor 286. Device 100 can include one or more processor(s) 286 and one or more of systems 220, 230, 240.

Processor 286, and other processing devices described herein, can each include one or more microprocessors, microcontrollers, field-programmable gate arrays (FPGAs), application-specific integrated circuits (ASICs), programmable logic devices (PLDs), programmable logic arrays (PLAs), programmable array logic devices (PALs), or digital signal processors (DSPs), or other devices for processing data, managing data, or handling data, whether implemented with electrical, magnetic, optical, biological components, or otherwise. Functions of processor 286 according to various aspects are discussed below with reference to FIGS. 3A-12.

The phrase "communicatively connected" includes any type of connection, wired or wireless, for communicating data between devices or processors. These devices or processors can be located in physical proximity or not. For example, subsystems such as peripheral system 220, user interface system 230, and data storage system 240 are shown separately from the data processing system 286 but can be stored completely or partially within the data processing system 286. The phrase "processor-accessible memory" is intended to include any data storage device to or from which processor 286 can transfer data, whether volatile or nonvolatile; removable or fixed; electronic, magnetic, optical, chemical, mechanical, or otherwise. Exemplary processor-accessible memories include but are not limited to: registers, floppy disks, hard disks, tapes, bar codes, Compact Discs, DVDs, read-only memories (ROM), erasable programmable read-only memories (EPROM, EEPROM, or Flash), and random-access memories (RAMs).

The peripheral system 220 can include or be communicatively connected to one or more devices configured to provide digital content records to the processor 286. Such devices can include digital still cameras, digital video cameras, cellular phones, or other data processors (e.g., imager 110). The processor 286, upon receipt of digital content records from a device in the peripheral system 220, can store such digital content records in the data storage system 240.

The user interface system 230 can include or be communicatively connected to touchscreen 120, a mouse, a keyboard, a joystick, another computer (connected, e.g., via a network or a null-modem cable), or any device or combination of devices from which data is input to the processor 286. The user interface system 230 can also include a processor-accessible memory or any device or combination of devices to which data is output by the processor 286. The user interface system 230 and the data storage system 240 can share a processor-accessible memory.

In various aspects, processor 286 includes or is connected to communication interface 215 that is coupled via network link 216 (shown in phantom) to network 250. For example, communication interface 215 can include a modem to communicate data via a telephone line; a network interface to communicate data via a local-area network (LAN), e.g., an Ethernet LAN or wide-area network (WAN); or a radio to communicate data via a wireless link, e.g., WIFI or GSM. Communication interface 215 sends and receives electrical or electromagnetic (e.g., radio or optical) signals that carry digital or analog data streams representing various types of information across network link 216 to network 250. Network link 216 can be connected to network 250 via a switch, gateway, hub, router, or other networking device.

Processor 286 can send messages and receive data, including program code, through network 250, network link 216 and communication interface 215. For example, a server (not shown) can store requested code for an application program (e.g., a JAVA applet) on a tangible non-volatile computer-readable storage medium to which it is connected. The server can retrieve the code from the medium and transmit it through network 250 to communication interface 215. The received code can be executed by processor 286 as it is received, or stored in data storage system 240 for later execution.

Data storage system 240 can include or be communicatively connected with one or more processor-accessible memories configured to store information. The memories can be, e.g., within a chassis or as parts of a distributed system.

In an example, data storage system 240 includes code memory 241, e.g., a RAM, and disk 243, e.g., a tangible computer-readable rotational storage device such as a hard drive. Computer program instructions are read into code memory 241 from disk 243. Processor 286 then executes one or more sequences of the computer program instructions loaded into code memory 241, as a result performing process steps described herein. In this way, processor 286 carries out a computer implemented process. For example, steps of methods described herein (discussed below with reference to, e.g., FIG. 3B), blocks of the flowchart illustrations (FIGS. 10, 12) or block diagrams herein, and combinations of those, can be implemented by computer program instructions. Code memory 241 can also store data, or can store only code.

Various aspects herein may be embodied as computer program products including computer readable program code stored on a tangible non-transitory computer readable medium, i.e., a non-transitory device or article of manufacture that participates in storing instructions that can be provided to processor 286 for execution. Such a medium can be manufactured as is conventional for such articles, e.g., by pressing a CD-ROM. The program code includes computer program instructions that can be loaded into processor 286 (and possibly also other processors), to cause functions, acts, or operational steps of various aspects herein to be performed by the processor 286 (or other processor). Computer program code for carrying out operations for various aspects described herein may be written in any combination of one or more programming language(s), and can be loaded from disk 243 into code memory 241 for execution. The program code may execute, e.g., entirely on processor 286, partly on processor 286 and partly on a remote computer connected to network 250, or entirely on the remote computer.

In view of the foregoing, and as is described in more detail below, embodiments of the invention measure geometric properties of objects 111, e.g., objects being inspected via a video inspection device. A technical effect is to measure dimensions or other features of a physical object, e.g., a jet-engine turbine blade or a pipe weld. This measurement can advantageously be performed in a non-contact manner. A further technical effect is to receive and process user input via touchscreen 120 and provide a visual representation of the received input and corresponding geometric properties.

Figure 3A:
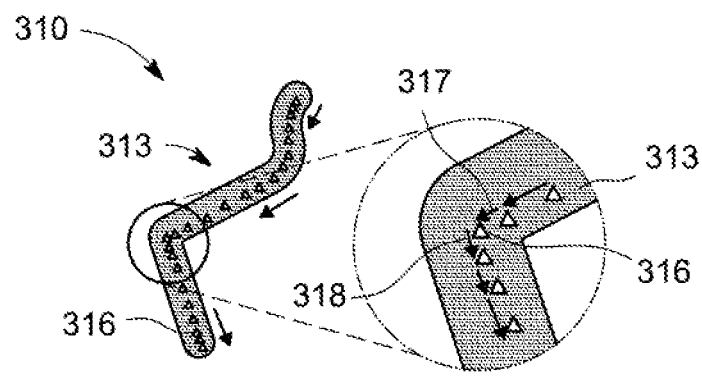
FIG. 3A is a graphical representation of exemplary touch data, e.g., received via a touchscreen.

FIG. 3A is a graphical representation of exemplary touch data 310, e.g., received via a touchscreen. In this example, user 238 touched the touchscreen with a finger (or stylus or other tool or body part, and likewise throughout); dragged the finger down and left, then down, then left and slightly down, and then down and slightly right; and then lifted the finger. Touch data 310 include a single touch path 313 representing travel of the finger while on touchscreen 120 (FIG. 1). Touch path 313 includes a plurality of touch locations 316. For example, touch data 310 can be collected by measuring the position of a touch on touchscreen 120 at regular intervals, e.g., every 50 ms or 100 ms. Each such measured position is one touch location 316. The inset further shows velocity vectors 317 between adjacent touch locations 316. Velocity vectors 317 are discussed below with reference to FIG. 3B.

Throughout this disclosure, "touch" refers to bringing the finger (or other implement) into a sensing range of touchscreen 120; "drag" refers to moving the finger while it is in the sensing range; "lift" or "lift-off" refer to removing the finger from the sensing range; and "tap" refers to bringing the finger into the sensing range and then removing the finger from sensing range after only a brief period, e.g., at most 500 ms or 250 ms or 100 ms. Processor 286 can detect a drag by detecting substantially continuous contact between touchscreen 120 and a finger extending over a plurality of touch locations 316. Processor 286 can require that at least two of the touch locations 316 be separated by a selected minimum distance, e.g., 6.25 mm (0.25 in.), before recognizing a drag, or can otherwise differentiate drags from taps. Processor 286 can detect a lift by receiving data from touch sensor 126 indicating no contact has been made with touchscreen 120 for a selected lift threshold, e.g., 200 ms. Processor 286 can detect a tap, e.g., by detecting a touch and a lift separated by less than a selected tap duration, e.g., 150 ms.

Figure 3B:
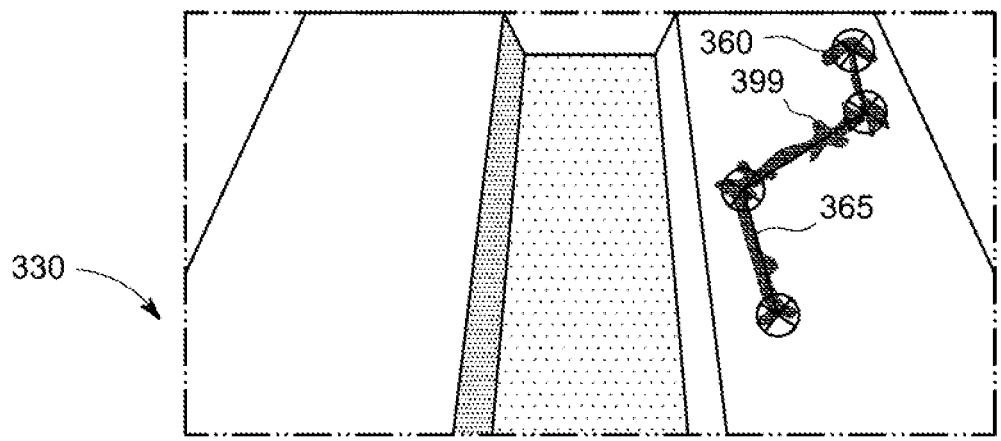
FIG. 3B is a graphical representation of an exemplary image of an object having an anomaly, and cursor points used for measuring a length of the anomaly.

FIG. 3B is a graphical representation of an exemplary image 330 of an object 111 (FIG. 1) having an anomaly 399, and cursor points 360 used for measuring a length of anomaly 399. For clarity, throughout the figures, not all cursor points 360 are labeled. Anomaly 399 can be, e.g., a crack, scratch, or inclusion on the surface of object 111. To measure the length of anomaly 399, user 238 can drag the finger along anomaly 399, producing touch data 310. Processor 286 (FIG. 2) is configured to automatically identify a plurality of cursor points 360 in the touch data 310. The cursor points can correspond to the object or surface to be measured. Processor 286 automatically determines a measurement type of the geometric property using the touch data, and then automatically determines the geometric property corresponding to the plurality of cursor points and the determined measurement type.

In this example, processor 286 has identified four cursor points 360 and determined that touch data 310 consist of a single touch path 313 that includes four substantially straight segments 365 forming an open path (i.e., not a loop or closed shape). For clarity, only one segment 365 is labeled. Based on these characteristics of touch data 310, processor 286 has determined that a multi-segment length measurement is desired. The geometric property is the sum of the lengths of the segments 365, which may be projected onto object 111 as described below with reference to FIG. 3C. In various aspects, processor 286 can determine that the measurement type is a length measurement (of one or more segments 365) if the touch data include or consist of one or more substantially connected touch path(s) that substantially form an open path, each of the touch path(s) including one or more substantially straight segments. Substantially connected touch paths have endpoints within a selected distance of each other. For example, dirt on touchscreen 120 or motion of user 238's location (e.g., on board ship) can cause one touch location 316 to be lost. This converts a continuous stroke with the finger into two separate but substantially connected touch paths.

In various aspects, processor 286 can identify cursor points 360 by determining ones of the touch locations 316 at which a magnitude of velocity vector 317 along the touch path 313 is substantially zero, or is less than a selected threshold, and at which a touch was maintained for at least a selected time. In various aspects, processor 286 can identify cursor points 360 by determining ones of the touch locations 316 at which the direction of the velocity changes more than a selected threshold, e.g., 30°, 45°, or 90°, within a selected time, a selected number of touch locations 316, or a selected distance on touchscreen 120. In the example shown, from velocity vector 317 to velocity vector 318, direction changes by approximately 67°. Therefore touch location 316 (between velocity vectors 317, 318) corresponds to a cursor point 360. The endpoints of touch paths 313 or of sets of substantially connected touch paths can also be selected as cursor points 360, as can the locations where user 238 initially contacts touchscreen 120 or lifts the finger off touchscreen 120.

Figure 3C:
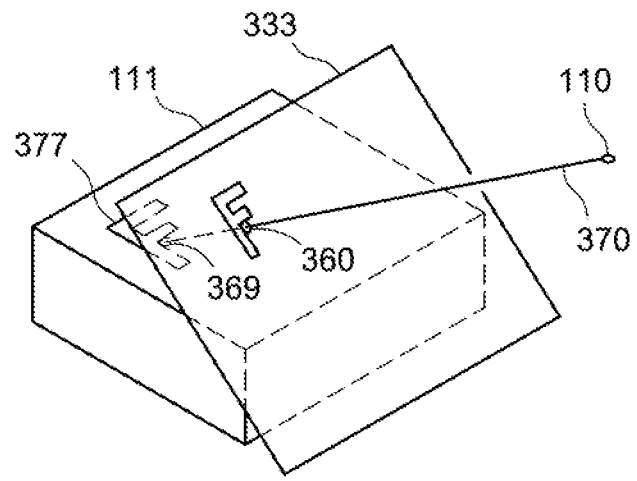
FIG. 3C is a graphical representation of an example of projection of a cursor point onto an object.

FIG. 3C is a graphical representation of projection of a cursor point 360 onto object 111. Object 111 has exemplary fiducial 377, shown for purposes of exposition. Image plane 333 is the plane on which features of object 111 are projected in the image captured by imager 110, e.g., image 330. Ray 370 shows the path of light from an exemplary point 369 on fiducial 377 through image plane 333 at cursor point 360 to imager 110. For clarity, the images of features other than fiducial 377 are not shown in image plane 333.

In various aspects, the cursor points 360 include respective two-dimensional (2-D) coordinates in the at least one image 330 of object 111. The processor 286 is configured to determine three-dimensional (3-D) coordinates of object 111 using the at least one image 130 of object 111. This can be done using information about the imaging geometry stored in data storage system 240. Processor 286 can also or alternatively be configured to cooperate with imager 110 to capture 3-D data and determine a mapping from the 2-D coordinates in image plane 333 to 3-D coordinates on the object. For example, an imager 110 configured for phase measurement projects a known pattern on object 111 while capturing image 330. Deviations of the pattern from its projected configuration indicate variations in the distance between the surface of object 111 and imager 110. Processor 286 can extract data of these deviations from the captured image 330 and use them to determine the 3-D coordinates. In another example, an imager 110 configured for stereo imaging can capture (as the at least one image 130) two images of object 111 from two different viewpoints. Processor 286 can provide 3-D data from the two 2-D images in a captured stereo image pair using stored information about the geometry of the two viewpoints.

After determining 3-D coordinates of object 111, processor 286 can select a plurality of the 3-D coordinates corresponding to the cursor points. For example, the 3-D coordinates of point 369 correspond to cursor point 360. This can be done by determining the intersection of object 111, as defined by its 3-D coordinates, with ray 370 from the position of imager 110 through each cursor point 360. 3-D coordinates within a selected distance of the intersection can be selected. Processor 286 can use the selected plurality of the 3-D coordinates to determine the geometric property. In the example shown in FIG. 3B, processor 286 projects each cursor point 360 into the 3-D coordinate space of object 111. Processor 286 then computes the 3-D Euclidean distance along each projected segment and sums those lengths to determine the total (the geometric property).

Accordingly, throughout this disclosure, discussion of cursor points 360 in reference to object 111, as opposed to image plane 333 or image 330, refers to the 3-D coordinates (e.g., point 369) corresponding to cursor points 360.

Figure 4A:
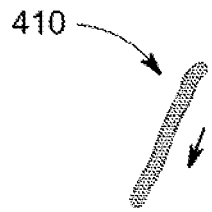
FIGS. 4A and 4B are graphical representations of exemplary touch data and exemplary object image data, respectively, illustrating a length measurement of an anomaly.
Figure 4B:
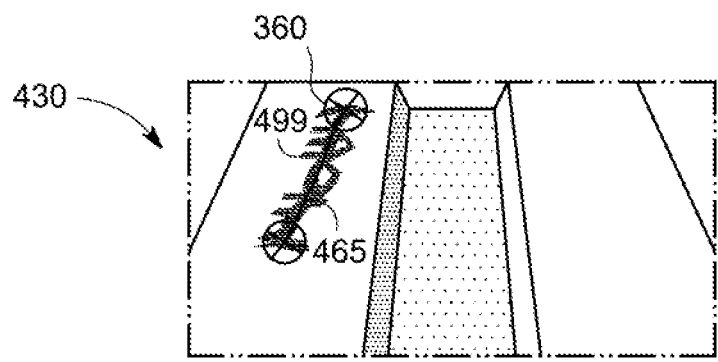

FIGS. 4A and 4B are graphical representations of exemplary touch data 410 and exemplary object image 430 data, respectively, illustrating a length measurement of an anomaly 499. Processor 286 performs processing described above with reference to FIG. 3B, only with one segment 465 instead of four segments 365. The geometric property is the distance on object 111 between the two cursor points 360 (specifically, the distance between the two corresponding points 369, as discussed above with reference to FIG. 3C, and likewise throughout).

Figure 5A:
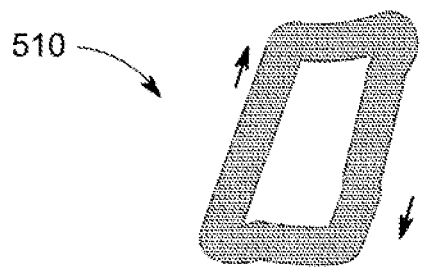
FIGS. 5A and 5B are graphical representations of exemplary touch data and exemplary object image data, respectively, illustrating an area measurement of an anomaly.
Figure 5B:
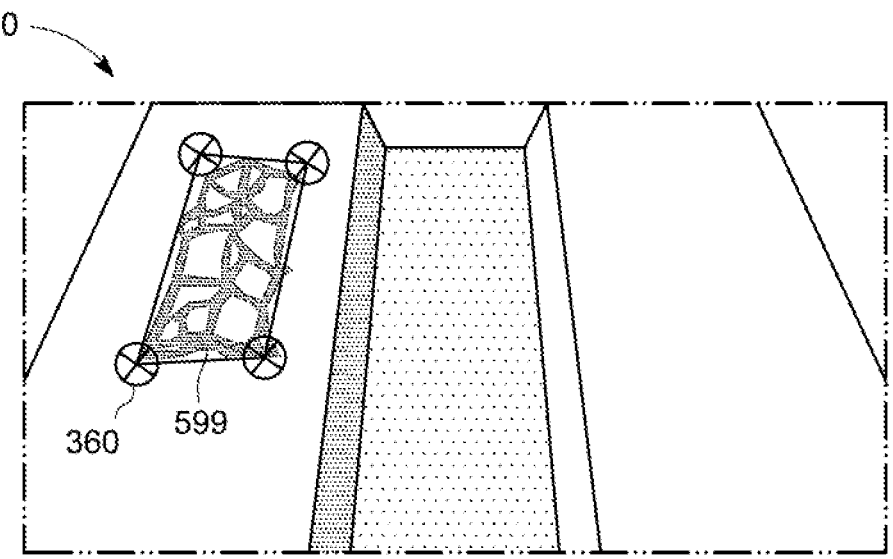

FIGS. 5A and 5B are graphical representations of exemplary touch data 510 and exemplary object image 530 data, respectively, illustrating an area measurement of anomaly 599. The processor 286 can determine that the measurement type is an area measurement if the touch data include or consist of one or more touch path(s) that substantially form a closed shape. In this example, the shape is a quadrilateral with corners on object 111 at the four cursor points 360 and the area can be computed as is known in the mathematical art. The closed shape can have any number or combination of corners, straight segments, or curved segments.

Figure 6A:
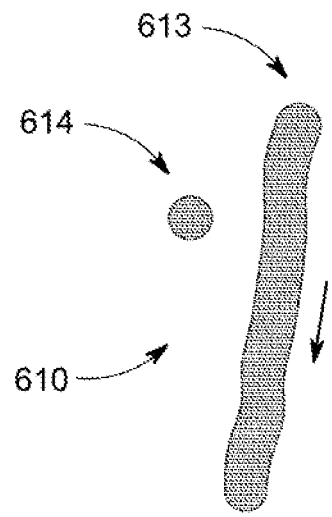
FIGS. 6A and 6B are graphical representations of exemplary touch data and exemplary object image data, respectively, illustrating a distance measurement between an anomaly and a feature of the object.
Figure 6B:
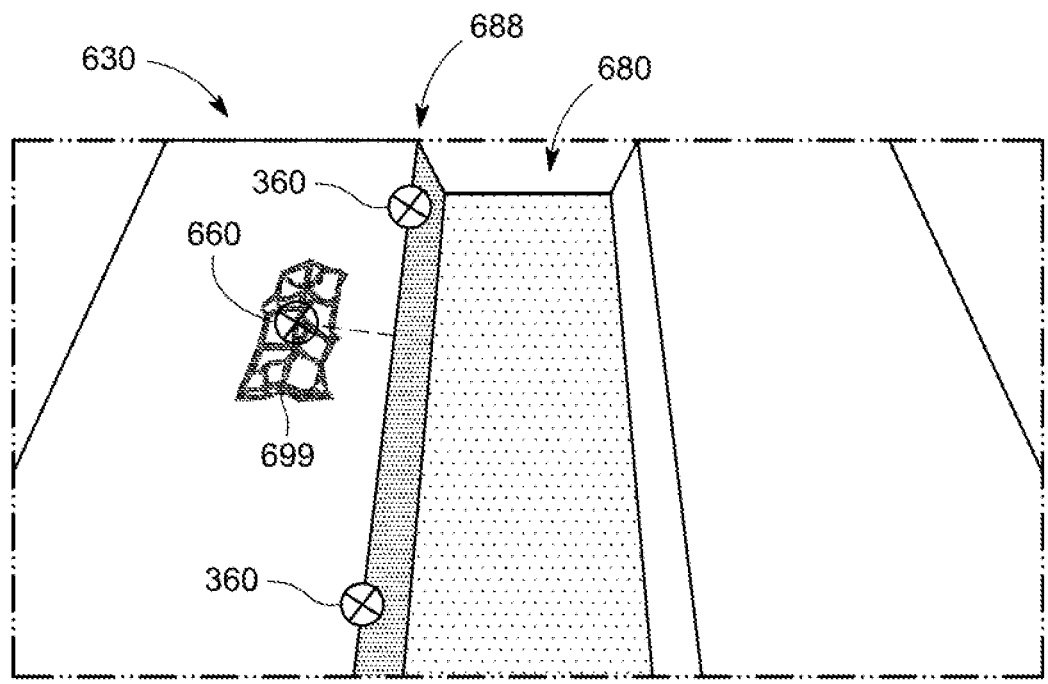

FIGS. 6A and 6B are graphical representations of exemplary touch data 610 and exemplary object image 630 data, respectively, illustrating a distance measurement between an anomaly 699 and a feature 688 of the object 111. This can be referred to as a "point-to-line" or "perpendicular-distance" measurement. Touch data 610 include two touch paths 613, 614. Touch path 613 is substantially straight and processor 286 determines two cursor points 360 corresponding to the two ends of touch path 613. Touch path 614 is substantially a single point, e.g., representative of the user's tapping or momentarily pressing on touchscreen 120. Processor 286 determines a single cursor point 660 corresponding to touch path 614. In general, a touch path includes one or more touch locations, and can include only one touch location, e.g., if the tap is very brief. Processor 286 can determine that the measurement type is a perpendicular-distance measurement if the touch data 610 include or consist of one substantially straight touch path and one tap. In this example, touch path 613 corresponds to feature 688, which is an upper edge of a trough 680 in object 111. Touch path 614 corresponds to anomaly 699 on the surface of object 111.

The perpendicular-distance measurement is the distance on object 111 from the line between the two cursor points 360 (corresponding to touch path 613; shown solid) to tap cursor point 660 along a normal (shown dashed) to the line. The cursor points 360, 660 are not limited to being placed on anomalies 699 or features 688, but can be positioned at any point(s) in the image 630, e.g., point(s) corresponding to object 111.

In various aspects, processor 286 is configured to perform either a length measurement or a point-to-line measurement depending on the touch data received. Therefore, when processor 286 receives touch path 613, processor 286 may not be able to determine whether touch path 613 represents a length measurement that should be performed, or represents the first touch path for a point-to-line measurement. In various aspects, processor 286 is configured to measure an elapsed time after a lift-off of a touch on touchscreen 120 (e.g., the end of touch path 613) and to determine that the touch data have been completely received when the elapsed time exceeds a selected timeout. When or after the touch data have been completely received, processor 286 proceeds to determine the measurement type.

Figure 7A:
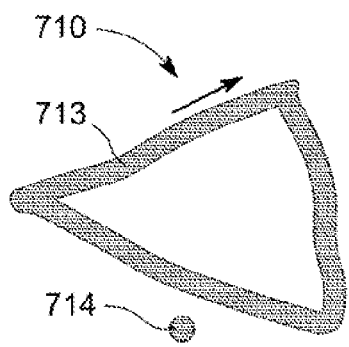
FIGS. 7A and 7B are graphical representations of exemplary touch data and exemplary object image data, respectively, illustrating a depth measurement of a trough in the object.
Figure 7B:
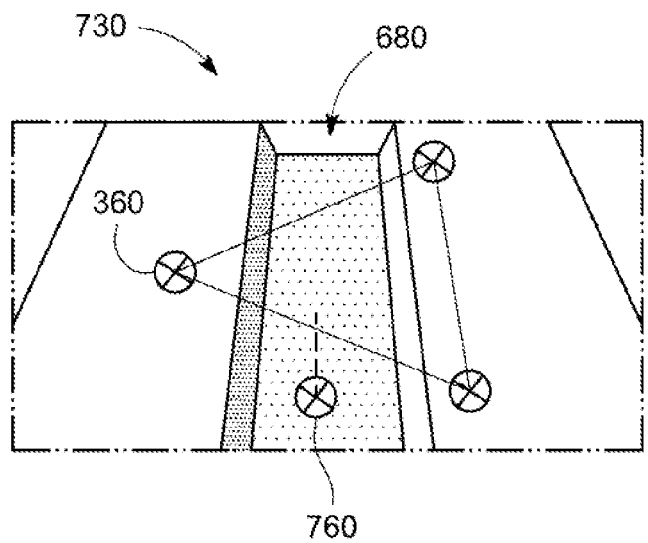

FIGS. 7A and 7B are graphical representations of exemplary touch data 710 and exemplary object image 730 data, respectively, illustrating a depth measurement of a trough 680 in object 111. Touch data 710 includes touch path 713 defining a substantially closed shape, and touch path 714 corresponding to a tap. The closed shape selects a plane or other geometrical surface through the cursor points 360 defined at the corners of the closed shape. The tap selects a point on object 111 and a corresponding cursor point 760. Processor 286 then determines the distance on object 111 between cursor point 760 and the geometrical surface, e.g., the distance from the plane to the point along a normal to the plane. This distance is shown dashed in FIG. 7B. In various aspects, processor 286 determines that the measurement type is a depth measurement if the touch data include or consist of one tap and one or more touch path(s) that substantially form a closed shape.

Figure 8A:
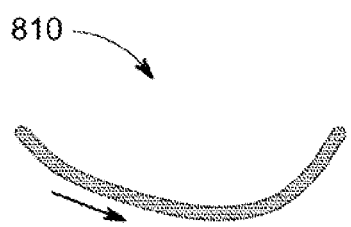
FIGS. 8A and 8B are graphical representations of exemplary touch data and exemplary object image data, respectively, illustrating a depth-profile measurement of a trough in the object.
Figure 8B:
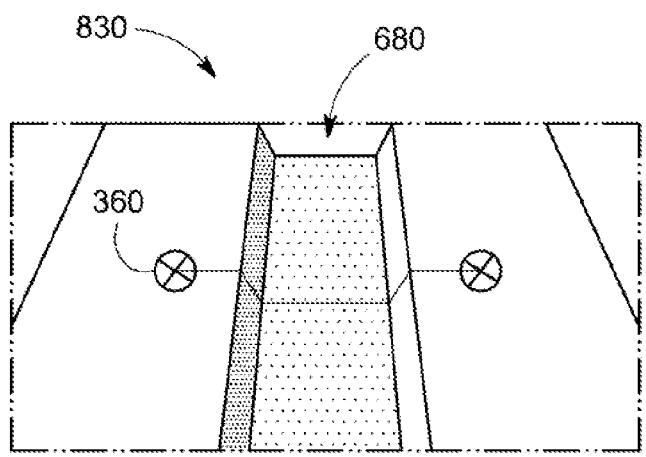

FIGS. 8A and 8B are graphical representations of exemplary touch data 810 and exemplary object image data 830, respectively, illustrating a depth-profile measurement of trough 680 in object 111. Touch data 810 include a substantially curved touch path. Processor 286 determines two cursor points 360 at the ends of the touch path. Processor 286 then computes a profile of the surface of object 111 along the line between the cursor points 360. This is represented graphically by the solid line between the cursor points 360. In various aspects, processor 286 determines the measurement type is a depth-profile measurement if the touch data include or consist of one substantially curved touch path.

In various aspects, processor 286 recognizes straight touch paths, curved touch paths, or other gestures or shapes of touch path using one or more reference record(s) of one or more gesture(s) stored in data storage system 240 (FIG. 2). Processor 286 is configured to compare the reference record(s) to respective portion(s) of the touch data and to select the measurement type corresponding to the stored reference record that most closely matches the respective portion of the touch data. This can be done, e.g., as is known in the optical-character-recognition (OCR) art. Processor 286 can be configured to rotate, skew, scale, or perform other affine or other transforms on the touch data, the reference records, or both while performing comparisons. One or more of the respective portion(s) can overlap or be the same. In an example, the full touch data are compared to each of the reference records.

In various aspects, processor 286 is further configured to automatically determine a respective closeness value between each stored reference record and the respective portion of the touch data, and to signal an error via touchscreen 120 if each of the respective closeness value(s) is outside a selected acceptance range. For example, if there are three stored reference records corresponding to three types of measurements processor 286 will recognize, and processor 286 cannot determine that received touch data correspond to any of the three (because all three closeness values are outside the range), processor 286 can request the user retry entering touch data via an error report.

As discussed above, processor 286 can determine measurement type based on, e.g., substantially straight touch paths or segments. For example, touch data for a length measurement (e.g., FIG. 4A) and for a depth-profile measurement (e.g., FIG. 8A) differ only in curvature. Accordingly, in various aspects processor 286 is further configured to determine respective curvature(s) of touch path(s) in the touch data and to compare the respective curvature(s) to a threshold to determine whether each of the touch path(s) is substantially straight or substantially curved. The curvature can be computed as is known in the mathematical art, e.g., as the second derivative of a smooth fit of the touch data, or as the inverse of the radius of curvature of a best-fitting circle at each touch location. Processor 286 can annotate the stored touch data with indications of whether segments are straight or curved, or can compute curvature as necessary during other processing.

Figure 9A:
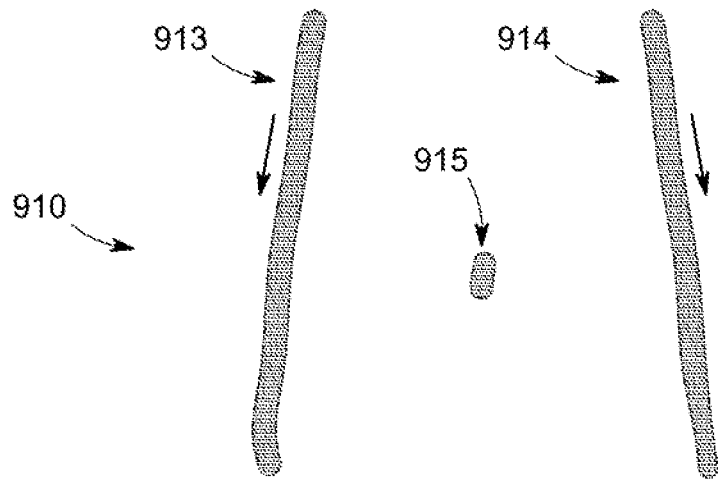
FIGS. 9A and 9B are graphical representations of exemplary touch data and exemplary object image data, respectively, illustrating a measurement of an offset distance between two surfaces.
Figure 9B:
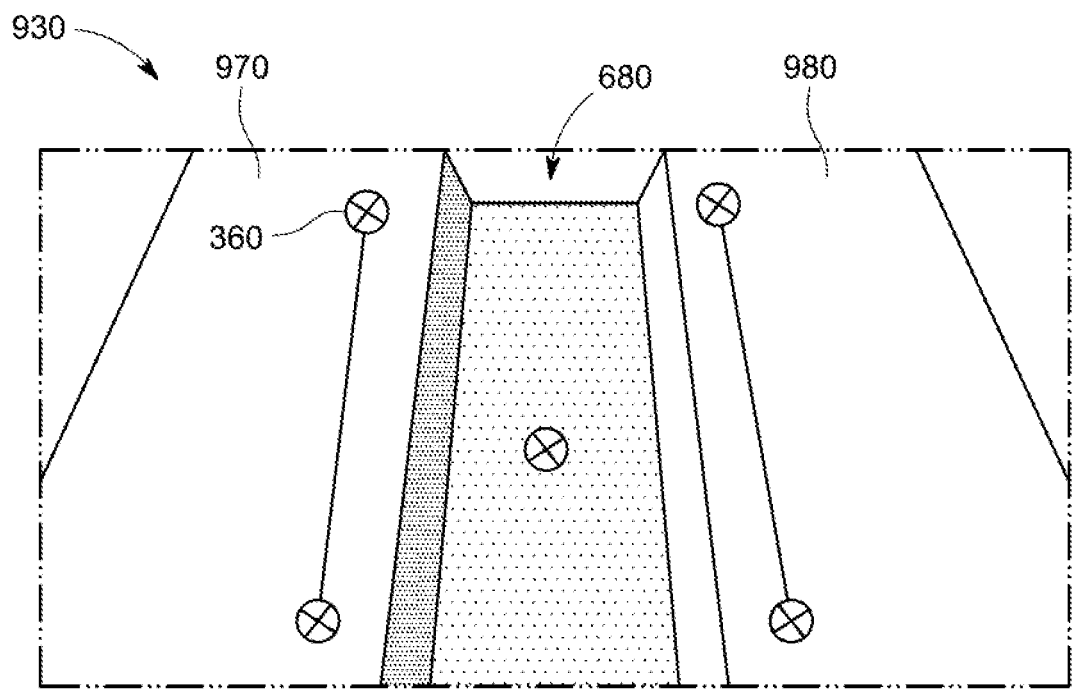

FIGS. 9A and 9B are graphical representations of exemplary touch data 910 and exemplary object image 930 data, respectively, illustrating a measurement of an offset distance between two surfaces 970, 980. In this example, surfaces 970, 980 are separated by trough 680. In general, surfaces 970, 980 can be any two different surfaces, or the same surface. Touch data 910 include substantially straight touch path 913, separate substantially straight touch path 914, and touch path 915 representing a tap. Touch path 913 selects surface 970 and touch path 914 selects surface 980. Touch path 915 identifies the desired measurement as a surface-offset measurement instead of two separate length measurements. Processor 286 can select surfaces 970, 980 on object 111, e.g., by regression analysis (surface-fitting) of touch paths 913, 914, corresponding cursor points 360, and 3-D data of the surface of object 111 in the vicinity of touch paths 913, 914. Processor 286 then mathematically extrapolates surfaces 970, 980 across image 930 and determines the closest between the extrapolations of surfaces 970, 980 at the tap point identified by touch path 915. Since surfaces 970, 980 can be non-parallel, the distance determined by processor 286 between them is a function of the tap point (touch path 915) as well as of the surfaces 970, 980 themselves. In various aspects, processor 286 determines that the measurement type is a surface-offset measurement if the touch data include or consist of two separated, substantially straight touch paths and one tap.

Figure 10:
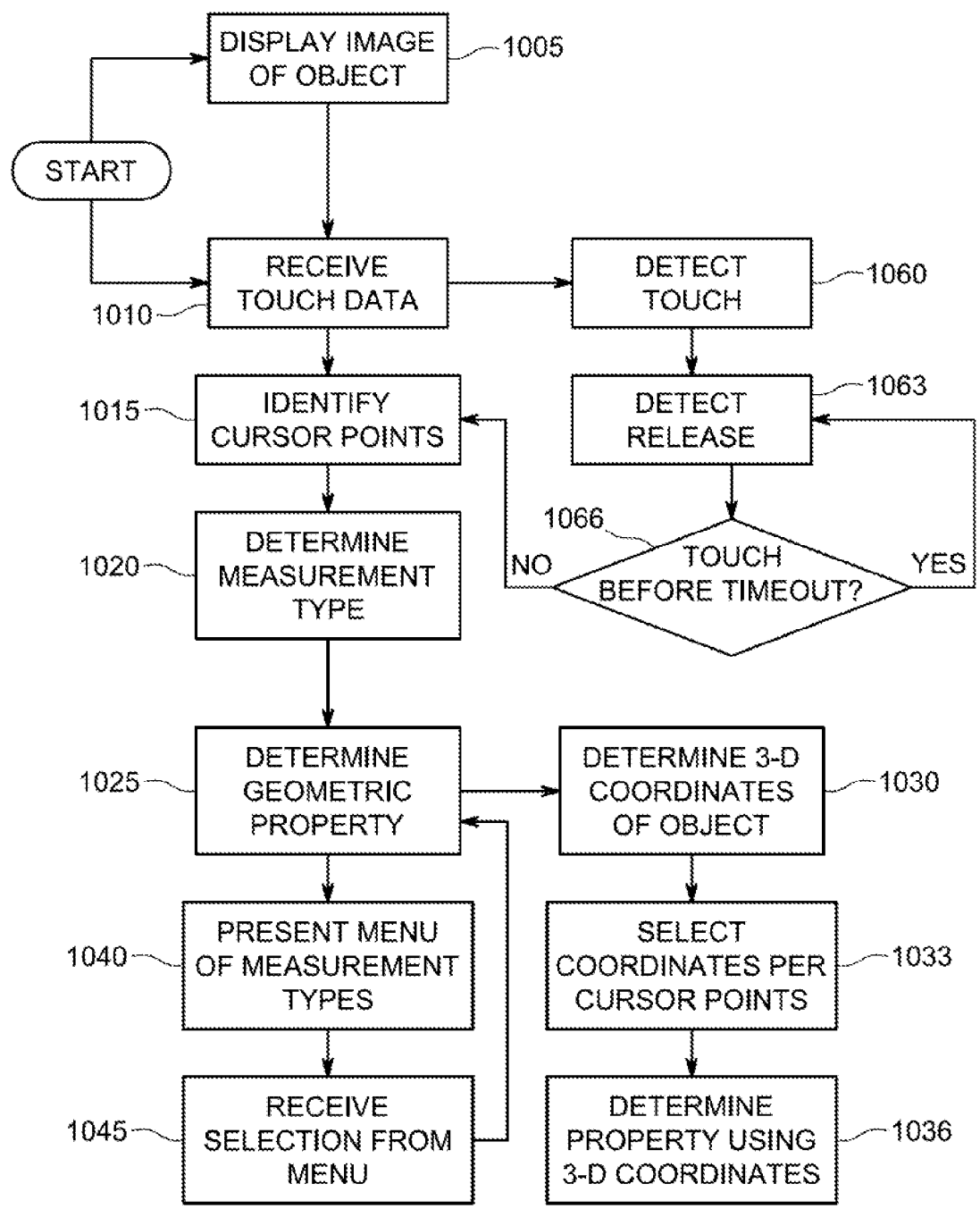
FIG. 10 is a flow diagram of exemplary methods of determining a type of a measurement or a geometric property of an object.

FIG. 10 is a flow diagram of exemplary methods of determining a type of a measurement or a geometric property of an object. The steps can be performed in any order except when otherwise specified, or when data from an earlier step is used in a later step. In various examples, processing begins with step 1005 (for determining a geometric property of an object) or with step 1010 (for determining a type of measurement). For clarity of explanation, reference is herein made to various components and features shown in FIGS. 1-3C that can carry out or participate in the steps of the exemplary method. It should be noted, however, that other components can be used; that is, exemplary method(s) shown in FIG. 10 are not limited to being carried out by the identified components.

In step 1005, an image of object 111 is displayed on touchscreen 120. This can be done as described above, e.g., with reference to FIGS. 1 and 2.

In step 1010, touch data are received via the touchscreen. The touch data can be provided by user 238 using a finger, stylus, or other implement. The touch data can include touch locations 316 and velocity vectors 317 (both FIG. 3A), or other forms of data. Touch data can be, e.g., as shown above in FIG. 3A, 4A, 5A, 6A, 7A, 8A, or 9A.

In step 1015, a plurality of cursor points are automatically identified in the touch data using processor 286. This can be as discussed above with reference to FIG. 3B.

In step 1020, a measurement type of the geometric property (or, in various aspects beginning with step 1010, a type of the measurement) is automatically determined using the touch data. This can be done, e.g., as discussed above with reference to the measurement types shown in FIGS. 3A-9B. Other gestures and measurement types can also be used. Further details of various embodiments are discussed below with reference to FIG. 12.

In step 1025, the geometric property corresponding to the plurality of cursor points and the determined measurement type is automatically determined by processor 286. This can be as described above with reference to FIGS. 3A-9B. These figures show exemplary geometric properties and measurement types; more or fewer measurement types than those shown can be provided in various aspects.

In various examples, the cursor points include respective two-dimensional (2-D) coordinates in the image of the object. Property-determining step 1025 includes steps 1030, 1033, 1036 in these examples. In step 1030, three-dimensional (3-D) coordinates of the object are determined using the image of the object; In step 1036, a plurality of the 3-D coordinates are selected corresponding to the 2-D coordinates of the cursor points. The selected plurality of 3-D coordinates can define or lie substantially on points, lines, curves, planes, or other surfaces of object 111. Steps 1030 and 1033 can be performed by processor 286 as discussed above with reference to FIG. 3C. In step 1036, the geometric property is determined using the selected plurality of the 3-D coordinates. This can be done, e.g., as discussed above with reference to FIG. 3B, 4B, 5B, 6B, 7B, 8B, or 9B.

In various aspects, identifying-cursor-points step 1015 is performed on touch data including a touch path 313 having a plurality of touch locations 316 (both FIG. 3A). Step 1015 includes determining ones of the touch locations 316 at which a magnitude of velocity along the touch path (represented by velocity vectors 317, FIG. 3A) is substantially zero. Step 1015 can further include selecting ones of the determined touch locations 316 at which a touch was maintained for at least a selected time. For example, cursor points can be corners between drag segments, places where user 238 paused within or between segments, or any combination.

In various aspects, type-determining step 1020 includes comparing stored reference record(s) of one or more gesture(s) to respective portion(s) of the touch data and selecting a type corresponding to the stored reference record that most closely matches the respective portion of the touch data. Type-determining step 1020 can further include automatically determining a respective closeness value between each stored reference record and the respective portion of the touch data and automatically signaling an error if each of the respective closeness value(s) is outside a selected acceptance range. The comparison and closeness determination can be done as described above with reference to FIG. 8B.

In various aspects, receiving step 1010 includes steps 1060 and 1063 and decision step 1066. In step 1060, a touch on the touchscreen is detected. In step 1063, a lift-off of the touch is detected. Decision step 1066 waits for a touch after the lift-off and monitors an elapsed time while doing so. When the monitored time exceeds a selected timeout, step 1010 is complete and control transfers to step 1015. If not, the next step is step 1063. In this way, processor 286 repeatedly detects the touch, detects the lift-off, measures a time after the lift-off, and determines the measurement type after the measured time since the lift-off exceeds a selected timeout.

In various aspects, decision step 1066 can include retrieving a timestamp of the lift-off from the touch data and determine whether any touch data were received in the timeout interval after the stamped time. In other aspects, processor 286 inserts a timeout indication in the touch data whenever a timeout elapses after the last detected touch. In these aspects, decision step 1066 includes inspecting the touch data to determine whether a timeout indication is present. Steps 1060, 1063, 1066 can be performed in real-time as touch data are received, or on stored touch data.

In various aspects, type-determining step 1020 includes determining that the type is: a length measurement if the touch data consist of one or more substantially connected touch path(s) that substantially form an open path, each of the touch path(s) including one or more substantially straight segment(s) (see, e.g., FIGS. 3A-4B); a depth-profile measurement if the touch data consist of one substantially curved touch path (FIGS. 8A-8B); a perpendicular-distance measurement if the touch data consist of one substantially straight touch path and one tap (FIGS. 6A-6B); an area measurement if the touch data consist of one or more touch path(s) that substantially form a closed shape (FIGS. 5A-5B); a depth measurement if the touch data consist of one tap and one or more touch path(s) that substantially form a closed shape (FIGS. 7A-7B); or a surface-offset measurement if the touch data consist of two separated, substantially straight touch paths and one tap (FIGS. 9A-9B). Step 1020 can include determining respective curvature(s) of touch path(s) in the touch data and comparing the respective curvature(s) to a threshold to determine whether each of the touch path(s) is substantially straight or substantially curved.

In various aspects, property-determining step 1025 is followed by step 1040. Steps 1040 and 1045 permit user 238 to change the measurement type from that determined in step 1020. In step 1040, a menu of measurement types is automatically presented, e.g., by processor 286, via the touchscreen. In step 1045, a selection from the menu of measurement types is received. The selection can include touch data corresponding to a displayed choice, as is discussed below with reference to FIG. 11. Step 1045 is followed by step 1025. In this way, a second geometric property corresponding to the plurality of cursor points and the selection is automatically determined.

Figure 11:
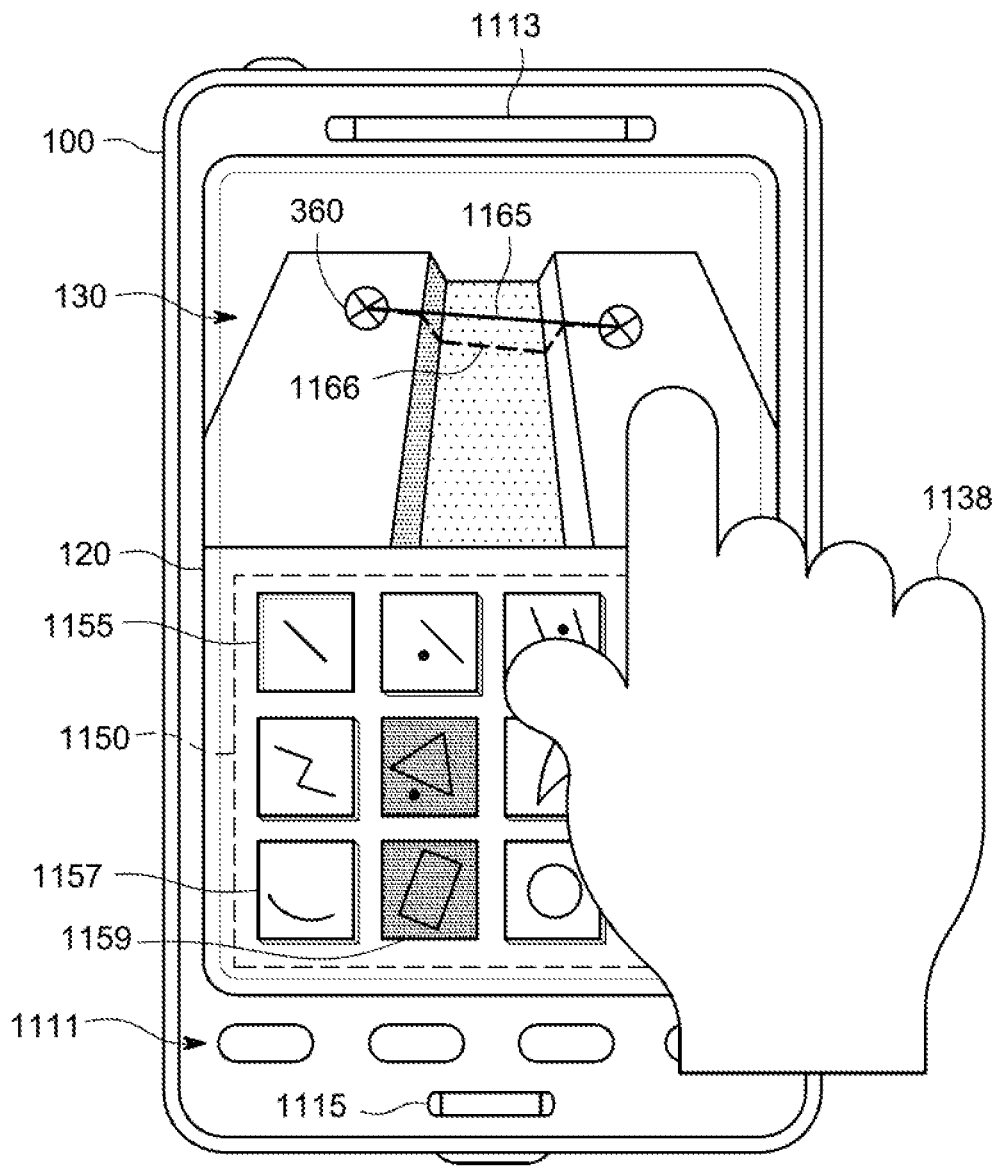
FIG. 11 is a schematic of another exemplary user interface of the device shown in FIG. 1.

FIG. 11 is a schematic of another exemplary user interface of device 100 showing image 130 and menu 1150 of measurement types as in step 1040 (FIG. 10). Processor 286 has displayed menu 1150 on touchscreen 120. Menu 1150 can include a pull-down menu, dialog box, text list, popup context menu, or other configuration of information display. Menu 1150 can also include graphical labels for physical softkeys 1111. Menu 1150 can include non-visual interface elements such as spoken words corresponding to the menu choices. Device 100 can include a speaker 1113 configured to reproduce the spoken words, and a dual-tone multi-frequency (DTMF) response unit or a microphone 1115 and a voice-recognition system to receive the user's selection from the menu.

The exemplary menu 1150 in FIG. 11 includes a plurality of graphical buttons; for clarity, only buttons 1155, 1157, 1159 are labeled. Button 1155 is shown depressed, indicating that processor 286 determined that the measurement type was a length measurement in step 1020. User 1138 can touch button 1157 to provide a selection of a depth-profile measurement type. In this example, processor 286 is displaying indicator 1165, corresponding to a length measurement, between cursor points 360. If user 1138 selects button 1157, processor 286 will display indicator 1166, corresponding to a depth-profile measurement between the cursor points 360. Processor 286 can determine which measurement types are applicable to the received touch data and either display only applicable types in the menu, or display inapplicable types in the menu in a way that indicates they are not available. In this example, button 1159 is displayed as inactive since the user has not provided a closed shape on which to perform an area measurement.

In various examples, processor 286 can also be responsive to other devices in user interface system 230 for setting control points or determining measurement types. For example, user interface system 230 can include a joystick, and processor 286 can move a pointer on display 123 (FIG. 1) in response to joystick input. This permits selecting measurement types and placing control points using the joystick in addition to doing so using touch sensor 126 (FIG. 1).

Figure 12:
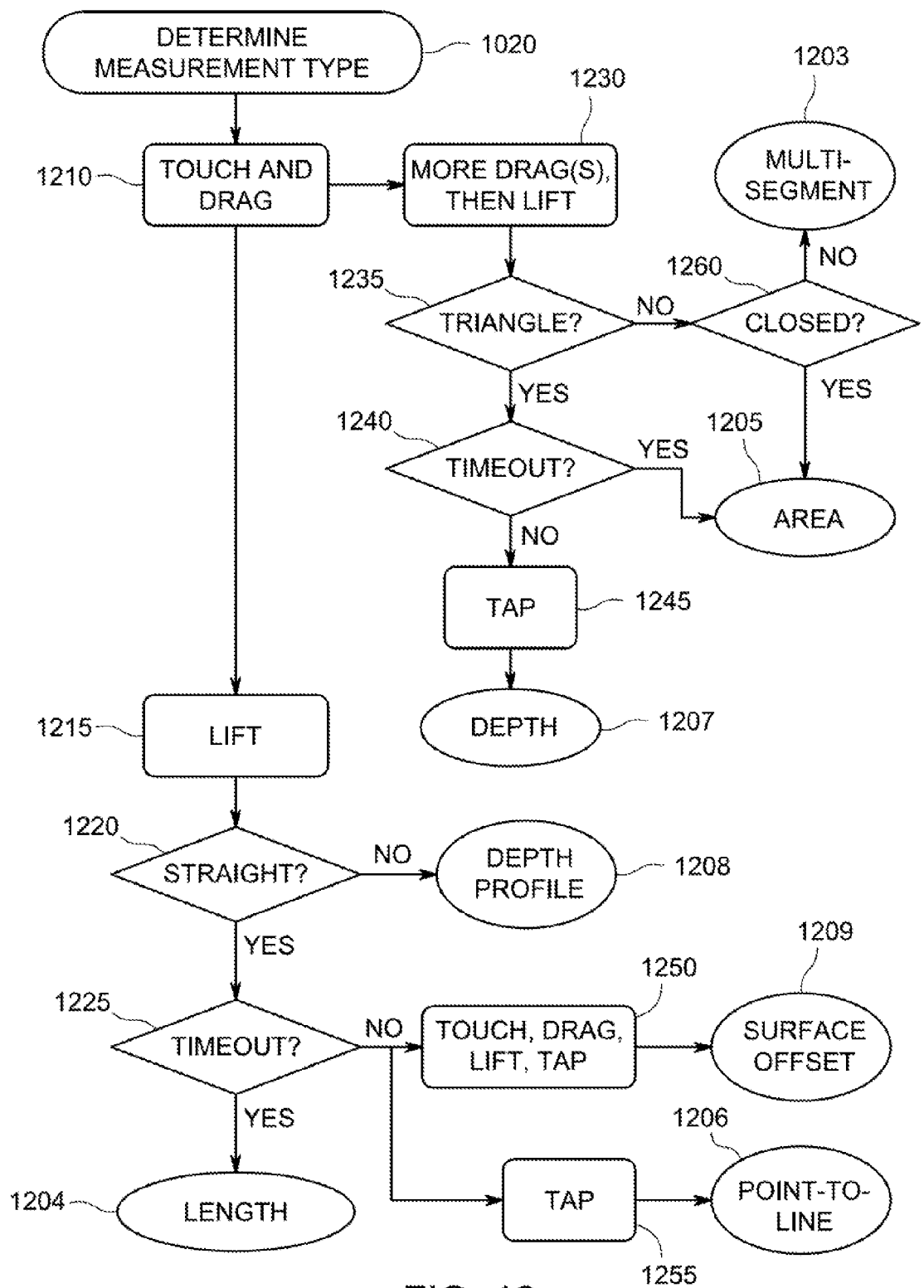
FIG. 12 is a flow diagram of an exemplary method of determining a type of a measurement.

FIG. 12 is a flow diagram of an exemplary method of determining a type of a measurement. Various illustrated steps or combinations thereof can be performed as part of step 1020 (FIG. 10). In at least one example, processing begins with step 1210. As discussed above, references to components or features of other figures in this application are not limiting, and other components or features can be used in these steps or to carry out these steps. Ovals represent the determined measurement types: multi-segment measurement type 1203 (see, e.g., FIGS. 3A-3B), length measurement type 1204 (FIGS. 4A-4B), area measurement type 1205 (FIGS. 5A-5B), point-to-line measurement type 1206 (FIGS. 6A-6B), depth measurement type 1207 (FIGS. 7A-7B), depth-profile measurement type 1208 (FIGS. 8A-8B), or surface-offset measurement type 1209 (FIGS. 9A-9B).

In carrying out the illustrated steps, the received touch data are considered in order of receipt. Each diamond represents a conventional decision step. Each rounded rectangle represents a decision step that determines whether the next touch data to be considered correspond to the indicated touch data. If so, that decision step "succeeds," the touch data that caused the decision step to succeed are discarded, and processing continues to the next step. If the next touch data to be considered do not correspond to the indicated touch data of the particular decision step, that step "fails" and processing ends. Processor 286 can, e.g., provide an error indication or take no action (ignore unknown gestures) if processing ends. Any rounded-rectangle step including more than one item of touch data (e.g., steps 1210, 1230, 1250) is shorthand for respective successive rounded-rectangle steps for each of the indicated items. In various aspects, processor 286 can execute a parsing algorithm or finite-state machine operating with the touch data as input and producing a measurement type as output. An example of processing touch data according to FIG. 12 is given in Table 1, and a corresponding implementation using regular expressions is given in Table 2.

TABLE 1

| Touch data (in order of receipt) | Step | is looking for | with the following result |
| --- | --- | --- | --- |
| Tap | 1210 | Touch and drag | fails |
| Timeout | 1210 | Touch and drag | fails |
| Touch and drag | 1210 | Touch and drag | succeeds |
| Drag | 1230 | Drag(s), then lift | (no result yet) |
| Lift | 1230 | Drag(s), then lift | succeeds |
| | 1235 | Triangle? | Only two drags, so not a triangle. |
| | 1260 | Closed shape? | Two drags with separate endpoints, so not a closed shape |
| | 1203 | | The touch data correspond to a multi-segment measurement type. |

TABLE 2

| Touch data | Step | is looking for | with the following result |
| --- | --- | --- | --- |
| pxtddL | 1210 | ^td | fails |
| xtddL | 1210 | ^td | fails |
| tddL | 1210 | ^td | succeeds |
| dL | 1230 | ^d + L | succeeds |
| | 1235 | Triangle? | Only two drags, so not a triangle. |
| | 1260 | Closed shape? | Two drags with separate endpoints, so not a closed shape |
| | 1203 | | The touch data correspond to a multi-segment measurement type. |

Key to touch data:
p = tap,
x = timeout,
t = touch,
d = drag,
L = lift.
Touch data are listed left-to-right in order of receipt.
Under "is looking for," "^" matches beginning of string; "x+" matches one or more x.

Specifically, step 1210 succeeds if the next touch data include a touch followed by a drag. Step 1210 is followed by step 1215 or step 1230, depending on the next touch data after the touch and drag.

Step 1215 succeeds if the next touch data include a lift. Step 1215 is followed by decision step 1220.

Decision step 1220 determines whether the received touch data of the drag correspond to a straight segment. This can be done as discussed above with reference to FIG. 8B. If the segment is not straight (i.e., is curved), the measurement type is depth-profile measurement type 1208. If the segment is straight, the next step is decision step 1225.

Decision step 1225 determines whether the lift was followed by a timeout, e.g., as discussed above with reference to decision step 1066 (FIG. 10). If so, the measurement type is length measurement type 1204. If not, the next step is step 1250 or step 1255 depending on the next touch data.

Step 1250 succeeds if the next touch data are, in order, a touch, a drag, a lift, and a tap. In this situation, the measurement type is surface-offset measurement type 1209.

Step 1255 succeeds if the next touch data item is a tap. In this situation, the measurement type is point-to-line measurement type 1206.

Referring back to step 1210, if the next touch data after the touch and drag are not a tap, step 1230 is next. Step 1230 succeeds if the next touch data after the drag are one or more additional drag(s) followed by a lift. If so, decision step 1235 is next.

Decision step 1235 determines whether the received touch data include a triangle, i.e., three drags that form a substantially closed shape. An example is touch path 713, FIG. 7A. If so, the next step is decision step 1240. If not, the next step is decision step 1260.

Decision step 1240 determines whether the triangle drags were followed by a timeout. This can be done as discussed above with reference to steps 1066, 1225. If so, the measurement type is area measurement type 1205. If not, the next step is step 1245.

Step 1245 succeeds if the next touch data item is a tap. If step 1245 succeeds, the measurement type is depth measurement type 1207.

Decision step 1260 determines whether the multiple drags form a closed shape. If so, the measurement type is area measurement type 1205. If not, the measurement type is multi-segment measurement type 1203.

The invention is inclusive of combinations of the aspects described herein. References to "a particular aspect" and the like refer to features that are present in at least one aspect of the invention. Separate references to "an aspect" or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention. Examples of variations, combinations, and modifications that are intended to be within the scope of the claims are those having structural elements that do not differ from the literal language of the claims and those including equivalent structural elements with insubstantial differences from the literal language of the claims.

What is claimed is:

1. A method for determining a geometric property of an object, the method comprising:
    displaying an image of the object on a touchscreen;
    receiving touch data via the touchscreen;
    automatically identifying a plurality of cursor points in the touch data using a processor;
    automatically determining a measurement type of the geometric property using the touch data;
    automatically determining the geometric property corresponding to the plurality of cursor points and the determined measurement type using the processor; and
    wherein the cursor points include respective two-dimensional (2-D) coordinates in the image of the object, and the geometric-property-determining step includes:
    determining three-dimensional (3-D) coordinates of the object using the image of the object;
    selecting a plurality of the 3-D coordinates corresponding to the 2-D coordinates of the cursor points; and
    determining the geometric property using the selected plurality of the 3-D coordinates.

2. The method according to claim 1, further including, after the geometric-property-determining step:
    automatically presenting a menu of measurement types via the touchscreen;
    receiving a selection from the menu of measurement types; and
    automatically determining a second geometric property corresponding to the plurality of cursor points and the selection.

3. The method according to claim 1, wherein the measurement-type-determining step includes comparing one or more stored reference records of one or more gestures to one or more respective portions of the touch data and selecting a measurement type corresponding to the stored reference record that most closely matches the respective portion of the touch data.

4. The method according to claim 3, wherein the measurement-type-determining step further includes automatically determining a respective closeness value between each stored reference record and the respective portion of the touch data and automatically signaling an error if each of the one or more respective closeness values is outside a selected acceptance range.

5. The method according to claim 1, wherein the receiving step includes repeatedly detecting a touch on the touchscreen, detecting a lift-off of the touch, measuring a time after the lift-off, and determining the measurement type after the measured time after the lift-off exceeds a selected timeout.

6. The method according to claim 1, wherein the touch data include a touch path having a plurality of touch locations and the identifying step includes determining ones of the touch locations at which a magnitude of velocity along the touch path is substantially zero.

7. The method according to claim 6, wherein the identifying step includes selecting ones of the determined touch locations at which a touch was maintained for at least a selected time.

8. The method according to claim 1, further including determining respective curvatures of one or more touch paths in the touch data and comparing the respective curvatures to a threshold to determine whether each of the touch paths is substantially straight or substantially curved, and determining that the measurement type is a depth-profile measurement if the touch data consist of one substantially curved touch path.

9. A method for determining a geometric property of an object, the method comprising:
    displaying an image of the object on a touchscreen;
    receiving touch data via the touchscreen;
    automatically identifying a plurality of cursor points in the touch data using a processor;
    automatically determining a measurement type of the geometric property using the touch data;
    automatically determining the geometric property corresponding to the plurality of cursor points and the determined measurement type using the processor; and
    wherein the measurement-type-determining step includes determining that the measurement type is:
    a) a length measurement if the touch data consist of one or more substantially connected touch paths that substantially form an open path, each of the touch paths including one or more substantially straight segments;
    b) a depth-profile measurement if the touch data consist of one substantially curved touch path;
    c) a perpendicular-distance measurement if the touch data consist of one substantially straight touch path and one tap;
    d) an area measurement if the touch data consist of one or more touch paths that substantially form a closed shape;
    e) a depth measurement if the touch data consist of one tap and one or more touch paths that substantially form a closed shape; or
    f) a surface-offset measurement if the touch data consist of two separated, substantially straight touch paths and one tap.

10. A method for determining a type of a measurement, the method comprising:
    receiving touch data via a touchscreen;
    automatically identifying a plurality of cursor points in the touch data using a processor;
    automatically determining the type of the measurement based on the touch data using the processor; and
    wherein the determining step includes determining that the type of the measurement is:
    a) a length measurement if the touch data consist of one or more substantially connected touch paths that substantially form an open path, each of the touch paths including one or more substantially straight segments;
    b) a depth-profile measurement if the touch data consist of one substantially curved touch path;
    c) a perpendicular-distance measurement if the touch data consist of one substantially straight touch path and one tap;

d) an area measurement if the touch data consist of one or more touch paths that substantially form a closed shape;

e) a depth measurement if the touch data consist of one tap and one or more touch paths that substantially form a closed shape; or f) a surface-offset measurement if the touch data consist of two separated, substantially straight touch paths and one tap.

11. A device for determining a geometric property of an object, the device comprising:

a) an imager for obtaining at least one image of the object;

b) a touchscreen for displaying the at least one image of the object and for receiving touch data;

c) a processor for:
        i) automatically identifying a plurality of cursor points in the touch data;
        ii) automatically determining a measurement type of the geometric property using the touch data; and
        iii) automatically determining the geometric property corresponding to the plurality of cursor points and the determined measurement type; and wherein the processor is configured to determine that the measurement type is:

a) a length measurement if the touch data consist of one or more substantially connected touch paths that substantially form an open path, each of the touch paths including one or more substantially straight segments;

b) a depth-profile measurement if the touch data consist of one substantially curved touch path;

c) a perpendicular-distance measurement if the touch data consist of one substantially straight touch path and one tap;

d) an area measurement if the touch data consist of one or more touch paths that substantially form a closed shape;

e) a depth measurement if the touch data consist of one tap and one or more touch paths that substantially form a closed shape; or f) a surface-offset measurement if the touch data consist of two separated, substantially straight touch paths and one tap.

12. The device according to claim 11, wherein the cursor points include respective two-dimensional (2-D) coordinates in the at least one image of the object and the processor is further configured to:

a) determine three-dimensional (3-D) coordinates of the object using the at least one image of the object;

b) select a plurality of the 3-D coordinates corresponding to the cursor points; and c) determine the geometric property using the selected plurality of the 3-D coordinates.

13. The device according to claim 11, further including a data storage system configured to store one or more reference records of one or more gestures, wherein the processor is configured to compare the reference records to respective portions of the touch data and to select the measurement type corresponding to the stored reference record that most closely matches the respective portion of the touch data.

14. The device according to claim 13, wherein the processor is further configured to automatically determine a respective closeness value between each stored reference record and the respective portion of the touch data and to signal an error via the touchscreen if each of the respective closeness values is outside a selected acceptance range.

15. The device according to claim 11, wherein the processor is configured to measure an elapsed time after a lift-off of a touch on the touchscreen and to determine the measurement type after the elapsed time exceeds a selected timeout.

16. The device according to claim 11, wherein the touch data include a touch path having a plurality of touch locations and the processor is configured to identify the plurality of cursor points by determining ones of the touch locations at which a magnitude of velocity along the touch path is substantially zero and at which a touch was maintained for at least a selected time.

17. The device according to claim 11, wherein the processor is further configured to determine respective curvatures of touch paths in the touch data and to compare the respective curvatures to a threshold to determine whether each of the touch paths is substantially straight or substantially curved.

\* \* \* \* \*